US012794435B2

(12) United States Patent
Yamaguchi et al.

(10) Patent No.: US 12,794,435 B2
(45) Date of Patent: Nov. 10, 2026

(54) ELECTRONIC COMPONENT

(71) Applicant: TDK Corporation, Tokyo (JP)

(72) Inventors: Kohei Yamaguchi, Tokyo (JP); Yukio Mitake, Tokyo (JP)

(73) Assignee: TDK CORPORATION, Tokyo (JP)

( * ) Notice: Subject to any disclaimer, the term of this patent is extended or adjusted under 35 U.S.C. 154(b) by 3 days.

(21) Appl. No.: 19/199,493

(22) Filed: May 6, 2025

(65) Prior Publication Data

US 2025/0357908 A1 Nov. 20, 2025

(30) Foreign Application Priority Data

May 20, 2024 (JP) ................................ 2024-082051

(51) Int. Cl.
*H03H 7/01* (2006.01)
*H03H 1/00* (2006.01)

(52) U.S. Cl.
CPC ........ *H03H 7/1766* (2013.01); *H03H 7/0115* (2013.01); *H03H 7/0161* (2013.01); *H03H 2001/005* (2013.01)

(58) Field of Classification Search
CPC ... H03H 7/1766; H03H 7/0115; H03H 7/0161
See application file for complete search history.

(56) References Cited

U.S. PATENT DOCUMENTS

2015/0351243 A1* 12/2015 Toda ...................... H03H 7/075 361/748
2018/0145651 A1* 5/2018 Kitami ...................... H03H 1/00
2024/0128944 A1* 4/2024 Takami ................ H03H 7/1758

FOREIGN PATENT DOCUMENTS

JP 2001-119258 A 4/2001

* cited by examiner

*Primary Examiner* — Samuel S Outten
(74) *Attorney, Agent, or Firm* — XSENSUS LLP

(57) ABSTRACT

An electronic component includes first and second filter circuits. The first filter circuit has a first inductor on a first conductor layer. The second filter circuit has a second inductor on a second conductor layer and a third inductor on a third conductor layer. These inductors are aligned side by side in a direction orthogonal to the stacking direction of the conductor layers. The third conductor layer is at the same vertical position as parts of the first and second conductor layers. The first and second conductor layers each have more layers than the third conductor layer.

7 Claims, 10 Drawing Sheets

U.S. Patent Nov. 10, 2026 Sheet 1 of 10 US 12,794,435 B2

ELECTRONIC COMPONENT

CROSS-REFERENCE TO RELATED APPLICATION

This application claims the benefit of Japanese Priority Patent Application No. 2024-082051 filed on May 20, 2024, the entire content of which is incorporated herein by reference.

TECHNICAL FIELD

The present disclosure relates to an electronic component.

BACKGROUND

Japanese Unexamined Patent Publication No. 2001-119258 discloses an electronic component including a low-pass filter circuit, a high-pass filter circuit, a first LC series resonant circuit, and a second LC series resonant circuit. In the electronic component described in Japanese Unexamined Patent Publication No. 2001-119258, the low-pass filter circuit is disposed between a first input/output terminal and a second input/output terminal, the high-pass filter circuit is disposed between the first input/output terminal and a third input/output terminal, the first series resonant circuit is disposed between the second input/output terminal and a ground, and the second series resonant circuit is disposed between the third input/output terminal and the ground.

SUMMARY

In the present disclosure, an electronic component capable of reducing a loss will be described.

An electronic component according to an aspect of the present disclosure includes an element body including a plurality of insulating layers and a plurality of conductor layers, the plurality of insulating layers and the plurality of conductor layers being stacked, a plurality of terminals disposed on the element body, a first filter circuit including at least one or more conductor layers of the plurality of conductor layers and configured to process a signal in a first frequency band, and a second filter circuit including at least one or more conductor layers of the plurality of conductor layers and configured to process a signal in a second frequency band higher than the first frequency band, in which the first filter circuit includes a first inductor formed by winding on a first conductor layer including two or more conductor layers of the plurality of conductor layers, the second filter circuit includes a second inductor formed by winding on a second conductor layer including two or more conductor layers of the plurality of conductor layers, and a third inductor formed by winding on a third conductor layer including one or more conductor layers of the plurality of conductor layers, the first inductor, the second inductor, and the third inductor are disposed side by side in a first direction orthogonal to a stacking direction in which the plurality of conductor layers is stacked in a plan view viewed in the stacking direction, the third conductor layer is positioned at an identical vertical position to a part of the first conductor layer and a part of the second conductor layer in the stacking direction, and each of a number of conductor layers of the plurality of conductor layers constituting the first conductor layer and a number of conductor layers of the plurality of conductor layers constituting the second conductor layer is larger than a number of conductor layers of the plurality of conductor layers constituting the third conductor layer.

According to each aspect and each embodiment of the present disclosure, the electronic component capable of reducing a loss can be obtained.

DETAILED DESCRIPTION

Figure 1:
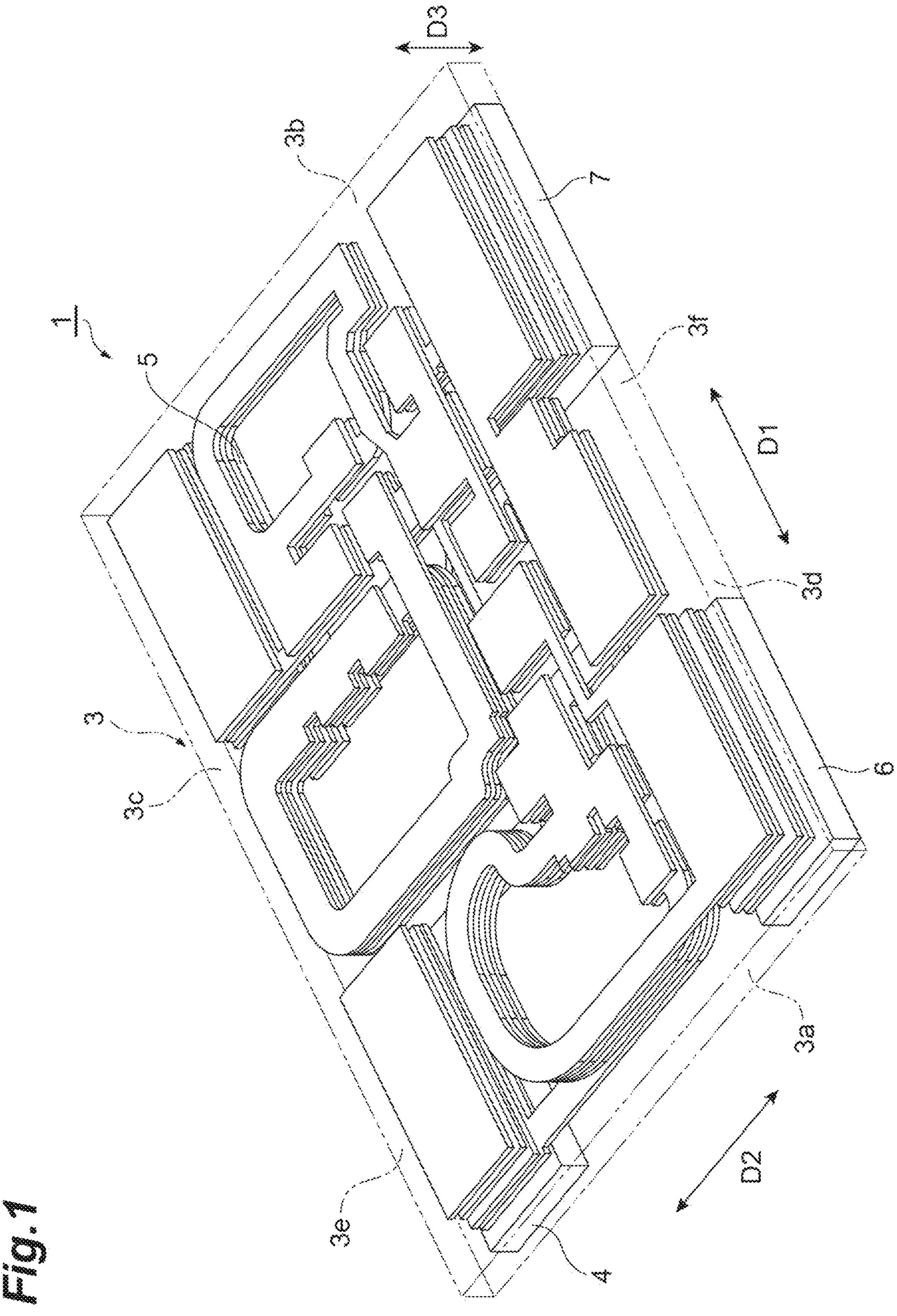
FIG. 1 is a perspective view of an electronic component according to an embodiment.

[1] Summary of Embodiments (1) An electronic component according to an aspect of the present disclosure includes:

an element body including a plurality of insulating layers and a plurality of conductor layers, the plurality of insulating layers and the plurality of conductor layers being stacked;

a plurality of terminals disposed on the element body;

a first filter circuit including at least one or more conductor layers of the plurality of conductor layers and configured to process a signal in a first frequency band; and a second filter circuit including at least one or more conductor layers of the plurality of conductor layers and configured to process a signal in a second frequency band higher than the first frequency band, in which the first filter circuit includes a first inductor formed by winding on a first conductor layer including two or more conductor layers of the plurality of conductor layers, the second filter circuit includes a second inductor formed by winding on a second conductor layer including two or more conductor layers of the plurality of conductor layers, and a third inductor formed by winding on a third conductor layer including one or more conductor layers of the plurality of conductor layers, the first inductor, the second inductor, and the third inductor are disposed side by side in a first direction orthogonal to a stacking direction in which the plurality of conductor layers is stacked in a plan view viewed in the stacking direction, the third conductor layer is positioned at an identical vertical position to a part of the first conductor layer and a part of the second conductor layer in the stacking direction, and each of a number of conductor layers of the plurality of conductor layers constituting the first conductor layer and a number of conductor layers of the plurality of conductor layers constituting the second conductor layer is larger than a number of conductor layers of the plurality of conductor layers constituting the third conductor layer.

In the electronic component according to one aspect of the present disclosure, the third conductor layer is positioned at an identical vertical position to a part of the first conductor layer and a part of the second conductor layer in the stacking direction. In other words, in the electronic component, the third conductor layer is not positioned at the identical vertical position to a portion other than the part of the first conductor layer and a portion other than the part of the second conductor layer in the stacking direction. In addition, in the electronic component, each of the number of conductor layers constituting the first conductor layer and the number of conductor layers constituting the second conductor layer is larger than the number of conductor layers constituting the third conductor layer. As a result, in the electronic component, electromagnetic coupling between the second inductor and the third inductor can be minimized. Therefore, in the electronic component, the loss can be reduced.

(2) In the electronic component according to (1), in the plan view viewed in the stacking direction, central axes of the second inductor and the third inductor may be offset from each other in a second direction orthogonal to the first direction. In this configuration, the electromagnetic coupling between the second inductor and the third inductor can be further minimized by offsetting (shifting) the central axes of the second inductor and the third inductor from each other.

(3) In the electronic component according to (1) or (2), the second inductor may be electrically connected to a first terminal of the plurality of terminals via a first conductor pattern disposed on a conductor layer of the plurality of conductor layers, the conductor layer being disposed between the plurality of terminals and the third conductor layer in the stacking direction, and the third conductor layer may not be adjacent to the conductor layer on which the first conductor pattern is disposed in the stacking direction. In this configuration, since the first conductor pattern connected to the second inductor and the third conductor layer are not adjacent to each other, electromagnetic coupling between the first conductor pattern and the third inductor formed by winding on the third conductor layer can be minimized. Therefore, in the electronic component, the loss can be further reduced.

(4) In the electronic component according to any one of (1) to (3), the number of conductor layers of the first conductor layer is larger than the number of conductor layers of the second conductor layer. In this configuration, the number of layers of the first conductor layer is different from the number of layers of the second conductor layer. As a result, in the electronic component, electromagnetic coupling between the first inductor formed by winding on the first conductor layer and the second inductor formed by winding on the second conductor layer can be minimized.

(5) In the electronic component according to any one of (1) to (4), in the part of the second conductor layer and a part of the third conductor layer positioned at an identical vertical position in the stacking direction, a part of a second conductor pattern constituting the second inductor and a part of a third conductor pattern constituting the third inductor may be adjacent to each other, and in a portion where the second conductor pattern constituting the second inductor and the third conductor pattern constituting the third inductor are adjacent to each other, a gap may be formed in one of the second conductor pattern and the third conductor pattern. In this configuration, since the gap is formed in one conductor pattern in a portion where the second inductor and the third inductor are adjacent to each other, electromagnetic coupling between the second inductor and the third inductor can be further minimized.

(6) In the electronic component according to any one of (1) to (5), the second filter circuit may include a first partial circuit including the second inductor and a second partial circuit including the third inductor, the first partial circuit may be a filter circuit configured to allow a signal having a frequency equal to or higher than a third frequency to pass, and the second partial circuit may be a filter circuit configured to allow a signal having a frequency higher than the third frequency and equal to or lower than a fourth frequency to pass.

(7) In the electronic component according to (6), the first filter circuit may include a first capacitor electrically connected in parallel with the first inductor, the second filter circuit may include a second capacitor electrically connected in parallel with the second inductor, the first capacitor may include a part of a winding portion of the first inductor, and the second capacitor may include a part of a winding portion of the third inductor.

[2] Exemplification of Embodiments

Hereinbelow, preferred embodiments of the present invention will be described in detail with reference to the accompanying drawings. Note that in the description of the drawings, the same or corresponding elements are denoted by the same reference numerals, and redundant descriptions thereof will be omitted.

Figure 2:
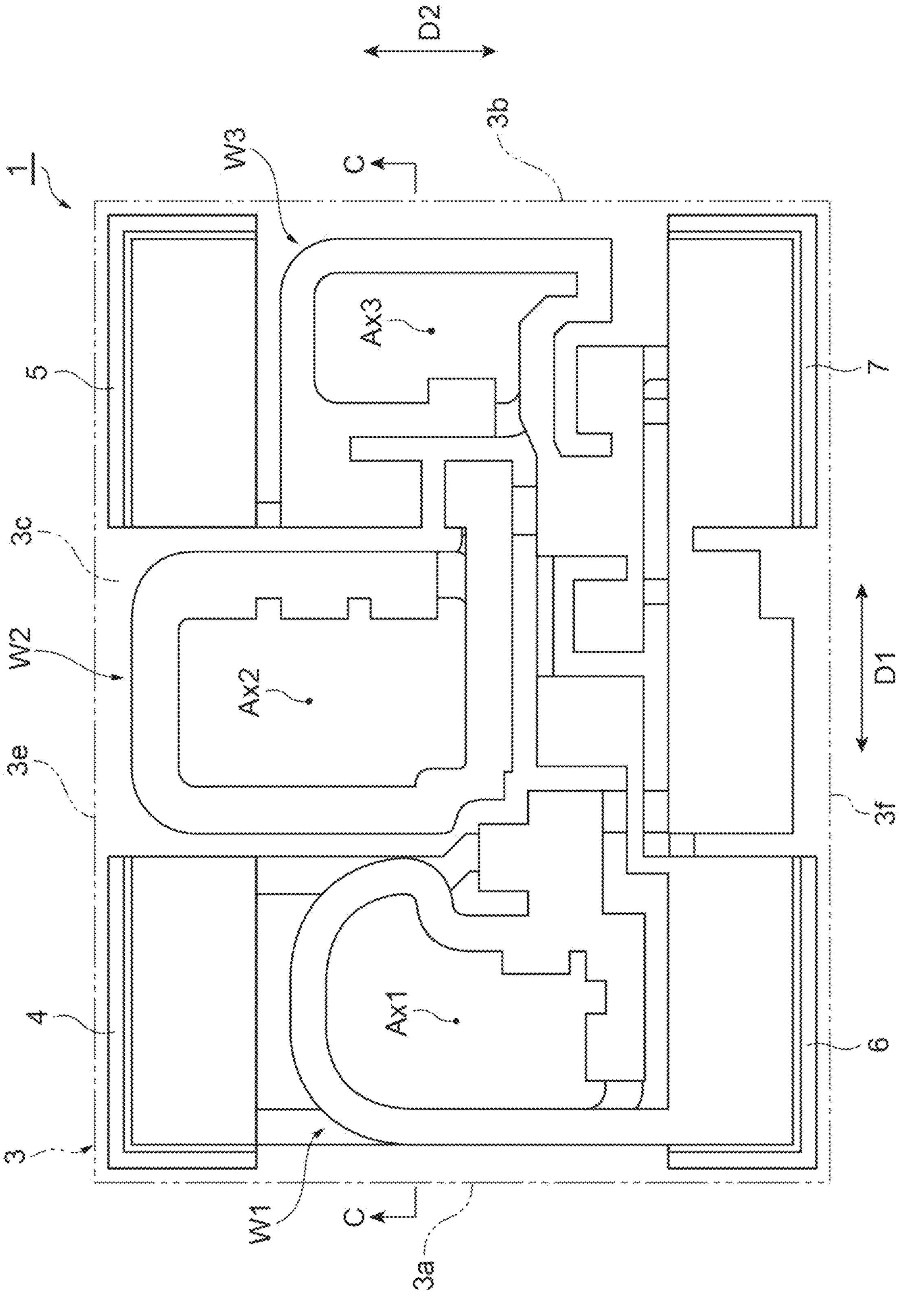
FIG. 2 is a plan view of the electronic component illustrated in FIG. 1.

FIG. 1 is a perspective view of an electronic component according to an embodiment. FIG. 2 is a plan view of the electronic component illustrated in FIG. 1. An electronic component 1 illustrated in FIGS. 1 and 2 is, for example, a directional coupler. As illustrated in FIGS. 1 and 2, the electronic component 1 includes an insulator (element body) 3, a first terminal electrode 4 disposed on the insulator 3, a second terminal electrode 5, a third terminal electrode 6, and a fourth terminal electrode (first terminal) 7.

The insulator 3 has a rectangular parallelepiped shape. The insulator 3 has, as the outer surfaces thereof, a pair of end surfaces 3*a* and 3*b* facing each other, a pair of main surfaces 3*c* and 3*d* facing each other, and a pair of side surfaces 3*e* and 3*f* facing each other.

A facing direction in which the pair of end surfaces 3*a* and 3*b* faces each other is a first direction D1. A facing direction in which the pair of side surfaces 3*e* and 3*f* faces each other is a second direction D2. A facing direction in which the pair of main surfaces 3*c* and 3*d* faces each other is a third direction D3. In the present embodiment, the first direction D1 is a longitudinal direction of the insulator 3. The second direction D2 is a width direction of the insulator 3, and is orthogonal to the first direction D1. The third direction D3 is a height direction of the insulator 3, and is orthogonal to the first direction D1 and the second direction D2.

The pair of end surfaces 3*a* and 3*b* extends in the third direction D3 to connect the pair of main surfaces 3*c* and 3*d*. The pair of end surfaces 3*a* and 3*b* also extends in the second direction D2. The pair of side surfaces 3*e* and 3*f* extends in the third direction D3 to connect the pair of main surfaces 3*c* and 3*d*. The pair of side surfaces 3*e* and 3*f* also extends in the first direction D1. The dimension of the insulator 3 in the first direction D1 is equal to the dimension of a substrate 2 in the first direction D1. The dimension of the insulator 3 in the second direction D2 is equal to the dimension of the substrate 2 in the second direction D2.

In the present embodiment, "equal" may be equal to a value including a slight difference or a manufacturing error in a preset range in addition to being equal. For example, in a case where a plurality of values are included within a range of ±5% of an average value of the plurality of values, the plurality of values are defined to be equal.

The insulator 3 is configured by stacking a plurality of insulator layers (not illustrated). The insulator layers contains an organic insulating material such as polyimide. The insulator layers are stacked in the third direction D3. That is, the third direction D3 is a stacking direction. In the actual insulator 3, the plurality of insulator layers is integrated to such an extent that boundaries between the layers cannot be visually recognized.

The first terminal electrode 4, the second terminal electrode 5, the third terminal electrode 6, and the fourth terminal electrode 7 are disposed on a main surface 3*d* of the insulator 3. In the present embodiment, the first terminal electrode 4 is an output terminal that outputs a signal in a specific frequency band. The frequency band of the signal output from the first terminal electrode 4 may be lower than a frequency band of a signal output from the second terminal electrode 5. The second terminal electrode 5 is an output terminal that outputs a signal in a specific frequency band. The frequency band of the signal output from the second terminal electrode 5 may be higher than the frequency band of the signal output from the first terminal electrode 4. The third terminal electrode 6 is an input terminal. The fourth terminal electrode 7 is a ground terminal.

The first terminal electrode 4, the second terminal electrode 5, the third terminal electrode 6, and the fourth terminal electrode 7 form a substantially rectangular shape in a plan view. The rectangular shape includes a shape in which corner portions and ridge portions are chamfered and a shape in which corner portions and ridge portions are rounded.

The first terminal electrode 4 is disposed at a position close to the end surface 3*a* and close to the side surface 3*e*. The second terminal electrode 5 is disposed at a position close to the end surface 3*b* and close to the side surface 3*e*. The third terminal electrode 6 is disposed at a position close to the end surface 3*a* and close to the side surface 3*f*. The fourth terminal electrode 7 is disposed at a position close to the end surface 3*b* and close to the side surface 3*f*. The first terminal electrode 4 and the second terminal electrode 5 are disposed at an interval in the first direction D1. The third terminal electrode 6 and the fourth terminal electrode 7 are disposed at an interval in the first direction D1. The first terminal electrode 4 and the third terminal electrode 6 are disposed at an interval in the second direction D2. The second terminal electrode 5 and the fourth terminal electrode 7 are disposed at an interval in the second direction D2. Intervals between the terminal electrodes may be appropriately selected according to specifications required for the electronic component 1.

The first terminal electrode 4, the second terminal electrode 5, the third terminal electrode 6, and the fourth terminal electrode 7 can contain an appropriate conductor (for example, gold, nickel, copper, silver, or the like).

Figure 3:
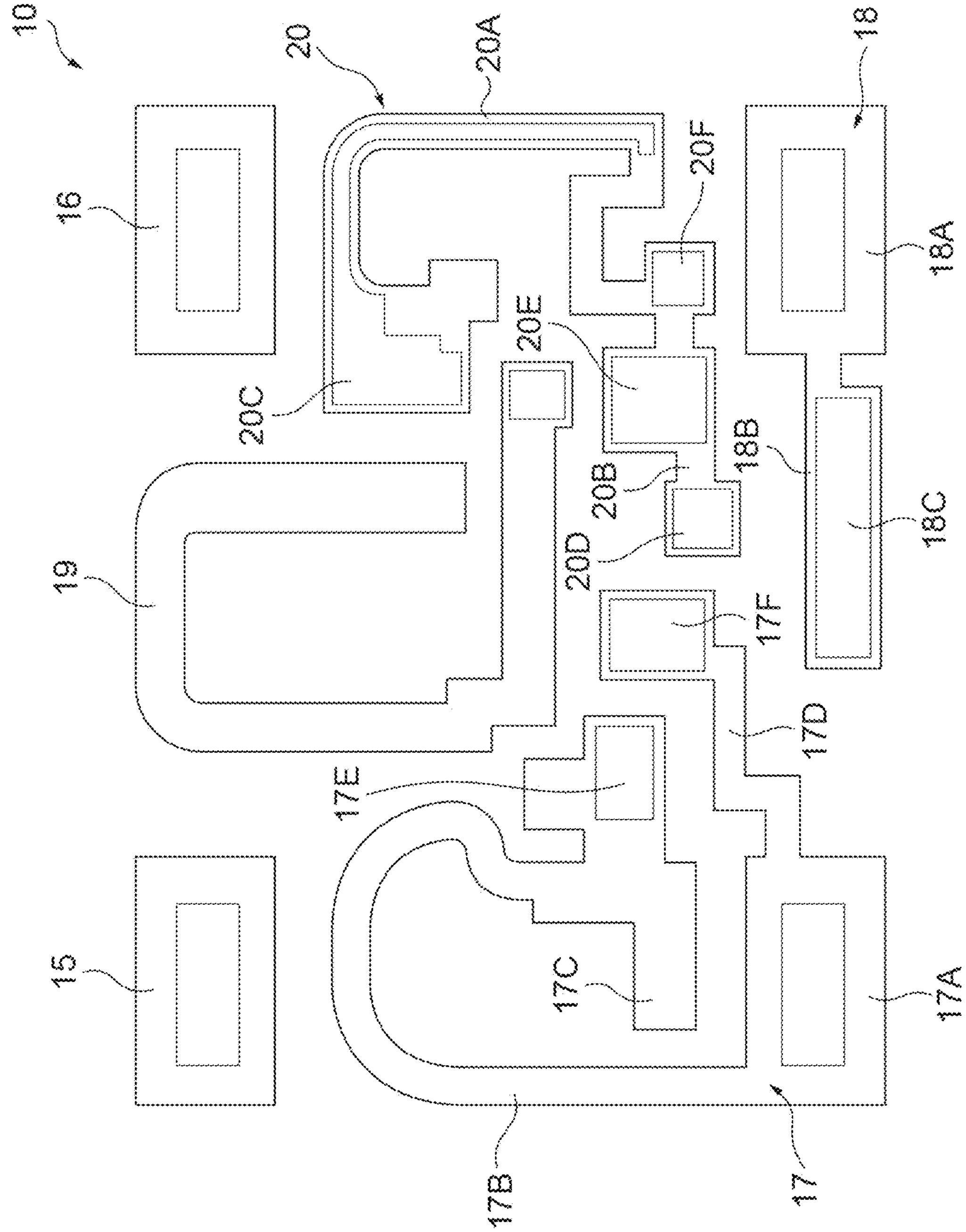
FIG. 3 is a view illustrating a conductor pattern of a conductor layer.
Figure 4:
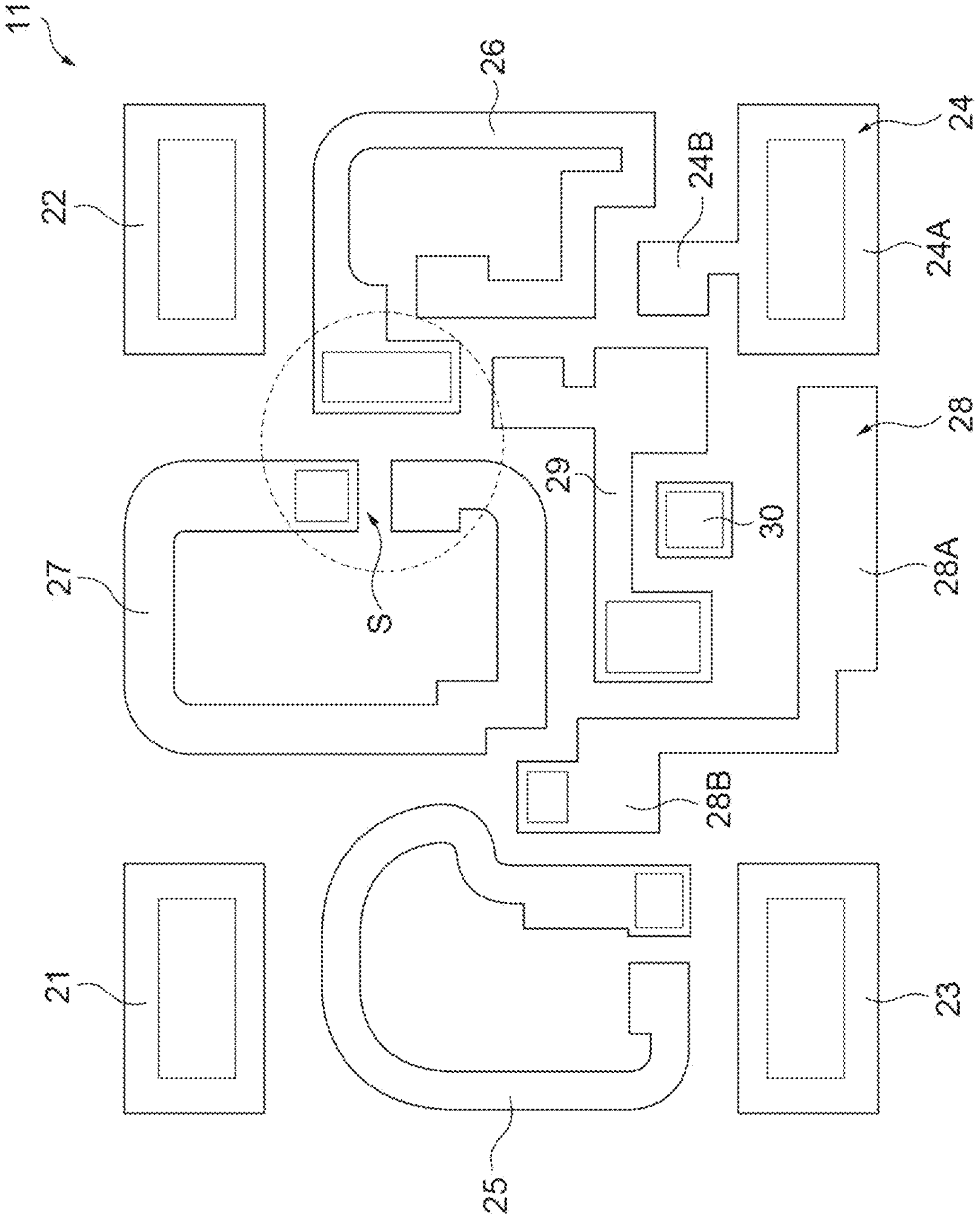
FIG. 4 is a view illustrating a conductor pattern of a conductor layer.
Figure 5:
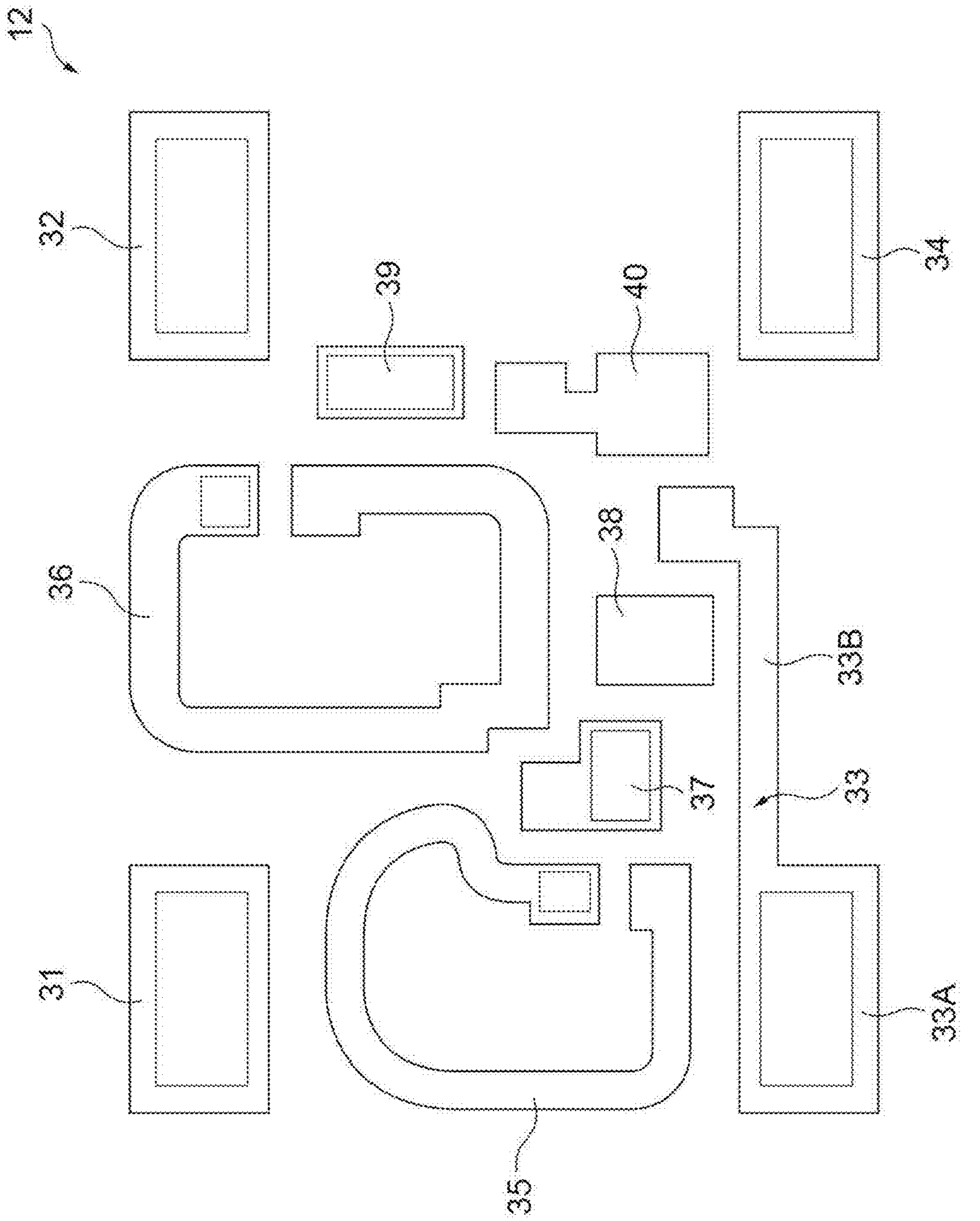
FIG. 5 is a view illustrating a conductor pattern of a conductor layer.
Figure 6:
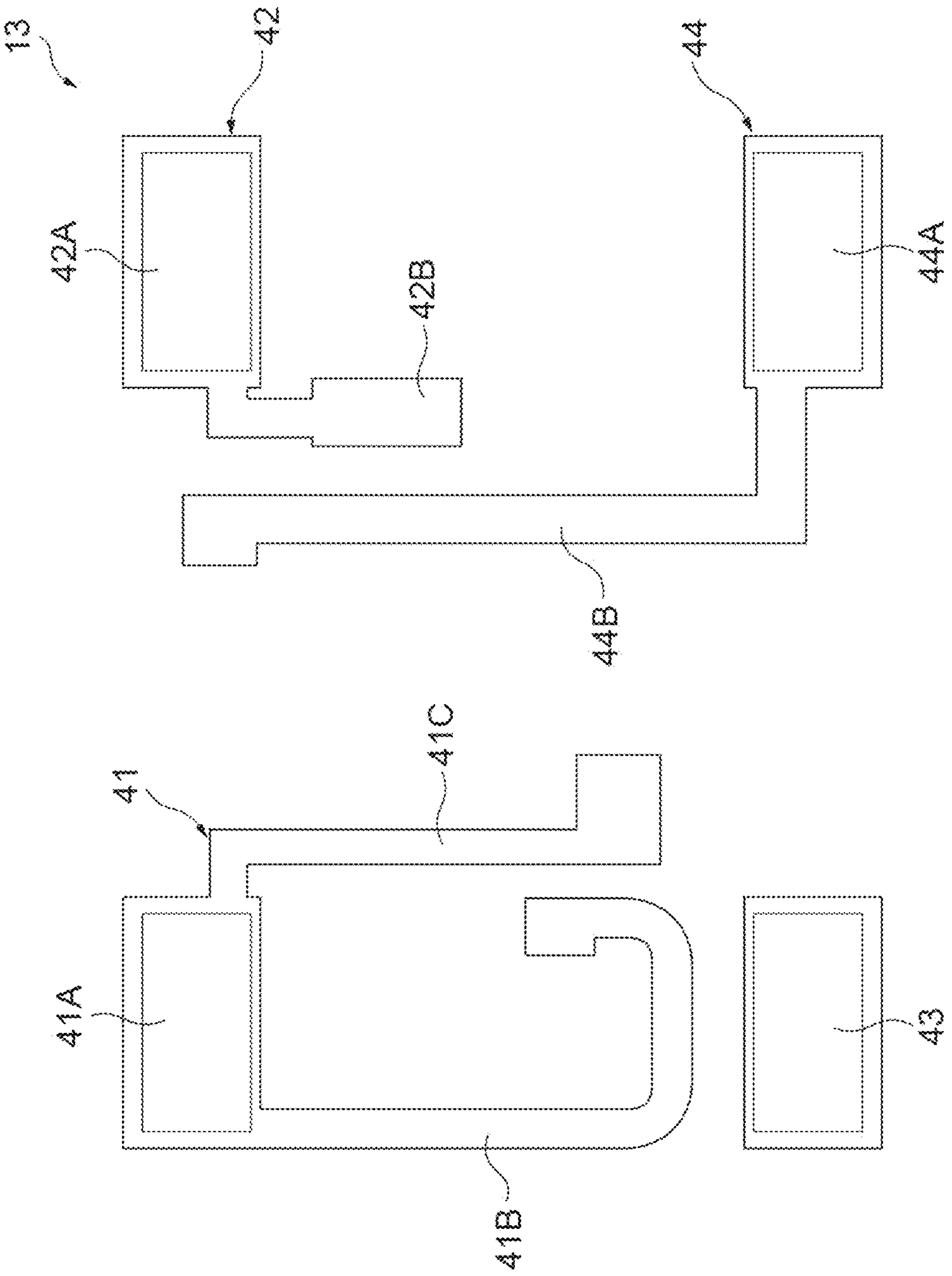
FIG. 6 is a view illustrating a conductor pattern of a conductor layer.

FIG. 3 is a view illustrating a conductor pattern of the first conductor layer included in the electronic component 1 illustrated in FIG. 1. FIG. 4 is a view illustrating a conductor pattern of the second conductor layer included in the electronic component 1 illustrated in FIG. 1. FIG. 5 is a view illustrating a conductor pattern of the third conductor layer included in the electronic component 1 illustrated in FIG. 1. FIG. 6 is a view illustrating a conductor pattern of the fourth conductor layer included in the electronic component 1 illustrated in FIG. 1.

In the electronic component 1, a conductor layer 10, a conductor layer 11, a conductor layer 12, and a conductor layer 13 are disposed in this order from the main surface 3*c* side of the insulator 3. In the electronic component 1, the conductor layer 10, the conductor layer 11, the conductor layer 12, and the conductor layer 13 are disposed on different layers in the third direction D3. Note that, in a case where the conductor patterns disposed in the different conductor layers in the stacking direction are electrically connected to each other, a via or a through-hole may be formed at each connection portion.

As illustrated in FIG. 3, the conductor layer 10 includes a conductor pattern 15, a conductor pattern 16, a conductor pattern 17, a conductor pattern 18, a conductor pattern 19, and a conductor pattern 20. The conductor pattern 15, the conductor pattern 16, the conductor pattern 17, the conductor pattern 18, the conductor pattern 19, and the conductor pattern 20 can contain an appropriate conductor (for example, copper or the like).

For convenience of description, FIG. 3 also illustrates a conductor layer (hereinafter, may be referred to as an intermediate conductor layer) that is stacked with a conductor pattern formed on the conductor layer 10 via an appropriate dielectric film (for example, silicon nitride or the like) and constitutes an upper electrode of a capacitor described later. Such an intermediate conductor layer may be formed, for example, between the conductor layer 10 and the conductor layer 11 in the third direction D3 (stacking direction). For the configuration illustrated in FIG. 3, at least a part of a fifth pattern portion 17E, at least a part of a sixth pattern portion 17F, at least a part of a third pattern portion 18C, at least a part of a third pattern portion 20C, at least a part of a fourth pattern portion 20D, at least a part of a fifth pattern portion 20E, and at least a part of a sixth pattern portion 20F may be formed as such intermediate conductor layers.

The conductor pattern 15 is disposed at a position close to the end surface 3*a* and close to the side surface 3*e*. The conductor pattern 16 is disposed at a position close to the end surface 3*b* and close to the side surface 3*e*.

The conductor pattern 17 is disposed at a position close to the end surface 3*a*. The conductor pattern 17 includes a first pattern portion 17A, a second pattern portion 17B, a third pattern portion 17C, a fourth pattern portion 17D, a fifth pattern portion 17E, and a sixth pattern portion 17F. The first pattern portion 17A, the second pattern portion 17B, the third pattern portion 17C, and the fourth pattern portion 17D may be electrically connected and integrally formed. The first pattern portion 17A is disposed at a position close to the end surface 3*a* and close to the side surface 3*f*.

The conductor pattern 18 includes a first pattern portion 18A, a second pattern portion 18B, and the third pattern portion 18C. The first pattern portion 18A and the second pattern portion 18B may be electrically connected and integrally formed. The first pattern portion 18A is disposed at a position close to the end surface 3*b* and close to the side surface 3*f*.

The conductor pattern 19 is disposed between the second pattern portion 17B of the conductor pattern 17 and a first pattern portion 20A of the conductor pattern 20 in a plan view viewed in the third direction D3. The conductor pattern 19 is disposed between the second pattern portion 17B of the conductor pattern 17 and the first pattern portion 20A of the conductor pattern 20 in the first direction D1.

The conductor pattern 20 is disposed at a position close to the end surface 3*b*. The conductor pattern 20 includes the first pattern portion 20A, a second pattern portion 20B, the third pattern portion 20C, the fourth pattern portion 20D, the fifth pattern portion 20E, and the sixth pattern portion 20F. The first pattern portion 20A and the second pattern portion 20B may be electrically connected and integrally formed.

As illustrated in FIG. 4, the conductor layer 11 includes a conductor pattern 21, a conductor pattern 22, a conductor pattern 23, a conductor pattern 24, a conductor pattern 25, a conductor pattern (second conductor pattern) 26, a conductor pattern (third conductor pattern) 27, a conductor pattern 28, a conductor pattern 29, and a conductor pattern 30. The conductor pattern 21, the conductor pattern 22, the conductor pattern 23, the conductor pattern 24, the conductor pattern 25, the conductor pattern 26, the conductor pattern 27, the conductor pattern 28, the conductor pattern 29, and the conductor pattern 30 can contain an appropriate conductor (for example, copper or the like).

The conductor pattern 21 is disposed at a position close to the end surface 3*a* and close to the side surface 3*e*. The conductor pattern 21 electrically connects the conductor pattern 15 of the conductor layer 10 and a conductor pattern 31 (described later) of the conductor layer 12. The conductor pattern 22 is disposed at a position close to the end surface 3*b* and close to the side surface 3*e*. The conductor pattern 22 electrically connects the conductor pattern 16 of the conductor layer 10 and a conductor pattern 32 (described later) of the conductor layer 12.

The conductor pattern 23 is disposed at a position close to the end surface 3*a* and close to the side surface 3*f*. The conductor pattern 23 electrically connects the first pattern portion 17A of the conductor pattern 17 of the conductor layer 10 and a first pattern portion 33A (described later) of a conductor pattern 33 of the conductor layer 12. The conductor pattern 24 is disposed at a position close to the end surface 3*b* and close to the side surface 3*f*. The conductor pattern 24 electrically connects the first pattern portion 18A of the conductor pattern 18 of the conductor layer 10 and a conductor pattern 34 (described later) of the conductor layer 12.

The conductor pattern 25 is disposed at a position close to the end surface 3*a*. One end of the conductor pattern 25 is electrically connected to the conductor pattern 17 of the conductor layer 10. The other end of the conductor pattern 25 is electrically connected to a conductor pattern 35 (described later) of the conductor layer 12.

The conductor pattern 26 is disposed at a position close to the end surface 3*b*. One end of the conductor pattern 26 is electrically connected to the conductor pattern 20 of the conductor layer 10. The other end of the conductor pattern 26 is electrically connected to a conductor pattern 39 of the conductor layer 12.

The conductor pattern 27 is disposed between the conductor pattern 25 and the conductor pattern 26 in the plan view viewed in the third direction D3. The conductor pattern 27 is disposed between the conductor pattern 25 and the conductor pattern 26 in the plan view viewed in the first direction D1. One end of the conductor pattern 27 is electrically connected to the conductor pattern 19 of the conductor layer 10. The other end of the conductor pattern 27 is electrically connected to a conductor pattern 36 (described later) of the conductor layer 12.

The conductor pattern 28 includes a first pattern portion 28A and a second pattern portion 28B. The first pattern portion 28A and the second pattern portion 28B may be electrically connected and integrally formed. The second pattern portion 28B is electrically connected to the third pattern portion 17C of the conductor pattern 17 of the conductor layer 10. The conductor pattern 29 is electrically connected to the conductor pattern 19 of the conductor layer 10. The conductor pattern 30 is electrically connected to a second pattern portion 33B (described layer) of the conductor pattern 33 of the conductor layer 12.

A part of the conductor pattern 26 and a part of the conductor pattern 27 are adjacent to each other in the first direction D1. In a portion where the conductor pattern 26 and the conductor pattern 27 are adjacent to each other (a portion surrounded by a broken line in FIG. 4), a gap S is formed in one of the conductor pattern 26 and the conductor pattern 27. In the present embodiment, the gap S is formed in the conductor pattern 27 in the portion where the conductor pattern 26 and the conductor pattern 27 are adjacent to each other. The gap S is a gap between one end and the other end of the conductor pattern 27. The interval of the gap S (the distance between one end and the other end of the conductor pattern 27) can be appropriately set. In the portion where the conductor pattern 26 and the conductor pattern 27 are adjacent to each other, the conductor pattern 26 extends in the second direction D2. When viewed from the first direction D1, the extending portion of the conductor pattern 26 is disposed at a position overlapping the gap S of the conductor pattern 27.

As illustrated in FIG. 5, the conductor layer 12 includes the conductor pattern 31, the conductor pattern 32, the conductor pattern 33, the conductor pattern 34, the conductor pattern 35, the conductor pattern 36, the conductor pattern 37, the conductor pattern 38, the conductor pattern 39, and a conductor pattern 40. The conductor pattern 31, the conductor pattern 32, the conductor pattern 33, the conductor pattern 34, the conductor pattern 35, the conductor pattern 36, the conductor pattern 37, the conductor pattern 38, the conductor pattern 39, and the conductor pattern 40 can contain an appropriate conductor (for example, copper or the like).

The conductor pattern 31 is disposed at a position close to the end surface 3*a* and close to the side surface 3*e*. The conductor pattern 31 electrically connects the conductor pattern 21 of the conductor layer 11 and a first pattern portion 41A (described later) of a conductor pattern 41 of the conductor layer 13.

The conductor pattern 32 is disposed at a position close to the end surface 3*b* and close to the side surface 3*e*. The conductor pattern 32 electrically connects the conductor pattern 22 of the conductor layer 11 and a first pattern portion 42A (described later) of a conductor pattern 42 of the conductor layer 13.

The conductor pattern 33 includes the first pattern portion 33A and the second pattern portion 33B. The first pattern portion 33A is disposed at a position close to the end surface 3*a* and close to the side surface 3*f*. The first pattern portion 33A electrically connects the conductor pattern 23 of the conductor layer 11 and a conductor pattern 44 (described later) of the conductor layer 13. The second pattern portion 33B is electrically connected to the conductor pattern 30 of the conductor layer 11.

The conductor pattern 34 is disposed at a position close to the end surface 3*b* and close to the side surface 3*f*. The conductor pattern 34 electrically connects a first pattern portion 24A of the conductor pattern 24 of the conductor layer 11 and a first pattern portion 44A (described later) of the conductor pattern 44 of the conductor layer 13.

The conductor pattern 35 is disposed at a position close to the end surface 3*a*. One end of the conductor pattern 35 is electrically connected to the conductor pattern 25 of the conductor layer 11. The other end of the conductor pattern 35 is electrically connected to a second pattern portion 41B (described layer) of the conductor pattern 41 of the conductor layer 13.

One end of the conductor pattern 36 is electrically connected to the conductor pattern 27 of the conductor layer 11. The other end of the conductor pattern 36 is electrically connected to a second pattern portion 44B (described layer) of the conductor pattern 44 of the conductor layer 13.

The conductor pattern 37 electrically connects the second pattern portion 28B of the conductor pattern 28 of the conductor layer 11 and a third pattern portion 41C (described later) of the conductor pattern 41 of the conductor layer 13. The conductor pattern 38 is electrically connected to the conductor pattern 29 of the conductor layer 11.

The conductor pattern 39 electrically connects the conductor pattern 26 of the conductor layer 11 and a second pattern portion 42B (described later) of the conductor pattern 42 of the conductor layer 13. The conductor pattern 40 is electrically connected to the conductor pattern 29 of the conductor layer 11.

As illustrated in FIG. 6, the conductor layer 13 includes the conductor pattern 41, the conductor pattern 42, a conductor pattern 43, and the conductor pattern 44. The conductor pattern 41, the conductor pattern 42, the conductor pattern 43, and the conductor pattern 44 can contain an appropriate conductor (for example, copper or the like).

The conductor pattern 41 includes the first pattern portion 41A, the second pattern portion 41B, and the third pattern portion 41C. The first pattern portion 41A, the second pattern portion 41B, and the third pattern portion 41C may be electrically connected and integrally formed. The first pattern portion 41A is disposed at a position close to the end surface 3*a* and close to the side surface 3*e*. The first pattern portion 41A electrically connects the conductor pattern 31 of the conductor layer 12 and the first terminal electrode 4. The second pattern portion 41B is electrically connected to the conductor pattern 35 of the conductor layer 12. The third pattern portion 41C is electrically connected to the conductor pattern 37 of the conductor layer 12.

The conductor pattern 42 includes the first pattern portion 42A and the second pattern portion 42B. The first pattern portion 42A and the second pattern portion 42B may be electrically connected and integrally formed. The first pattern portion 42A is disposed at a position close to the end surface 3*b* and close to the side surface 3*e*. The first pattern portion 42A electrically connects the conductor pattern 32 of the conductor layer 12 and the second terminal electrode 5. The second pattern portion 42B is electrically connected to the conductor pattern 39 of the conductor layer 12.

The conductor pattern 43 is disposed at a position close to the end surface 3*a* and close to the side surface 3*f*. The conductor pattern 43 electrically connects the first pattern portion 33A of the conductor pattern 33 of the conductor layer 12 and the third terminal electrode 6.

The conductor pattern 44 includes the first pattern portion 44A and the second pattern portion 44B. The first pattern portion 44A and the second pattern portion 44B may be electrically connected and integrally formed. The first pattern portion 44A is disposed at a position close to the end surface 3*b* and close to the side surface 3*f*. The first pattern portion 44A electrically connects the conductor pattern 34 of the conductor layer 12 and the fourth terminal electrode 7.

The second pattern portion 44B is electrically connected to the conductor pattern 36 of the conductor layer 12. The second pattern portion 44B is a connection pattern that electrically connects an inductor L2 (see FIG. 7) described later and the fourth terminal electrode 7. That is, the inductor L2 is electrically connected to the fourth terminal electrode 7 via the second pattern portion 44B. The second pattern portion 44B is disposed on the conductor layer 13 disposed between a third conductor layer EL3 (see FIG. 8) and the first terminal electrode 4, the second terminal electrode 5, the third terminal electrode 6, and the fourth terminal electrode 7. The conductor layer 13 on which the second pattern portion 44B is disposed is not adjacent to the third conductor layer EL3 (see FIG. 8) described later in the third direction D3.

Figure 7:
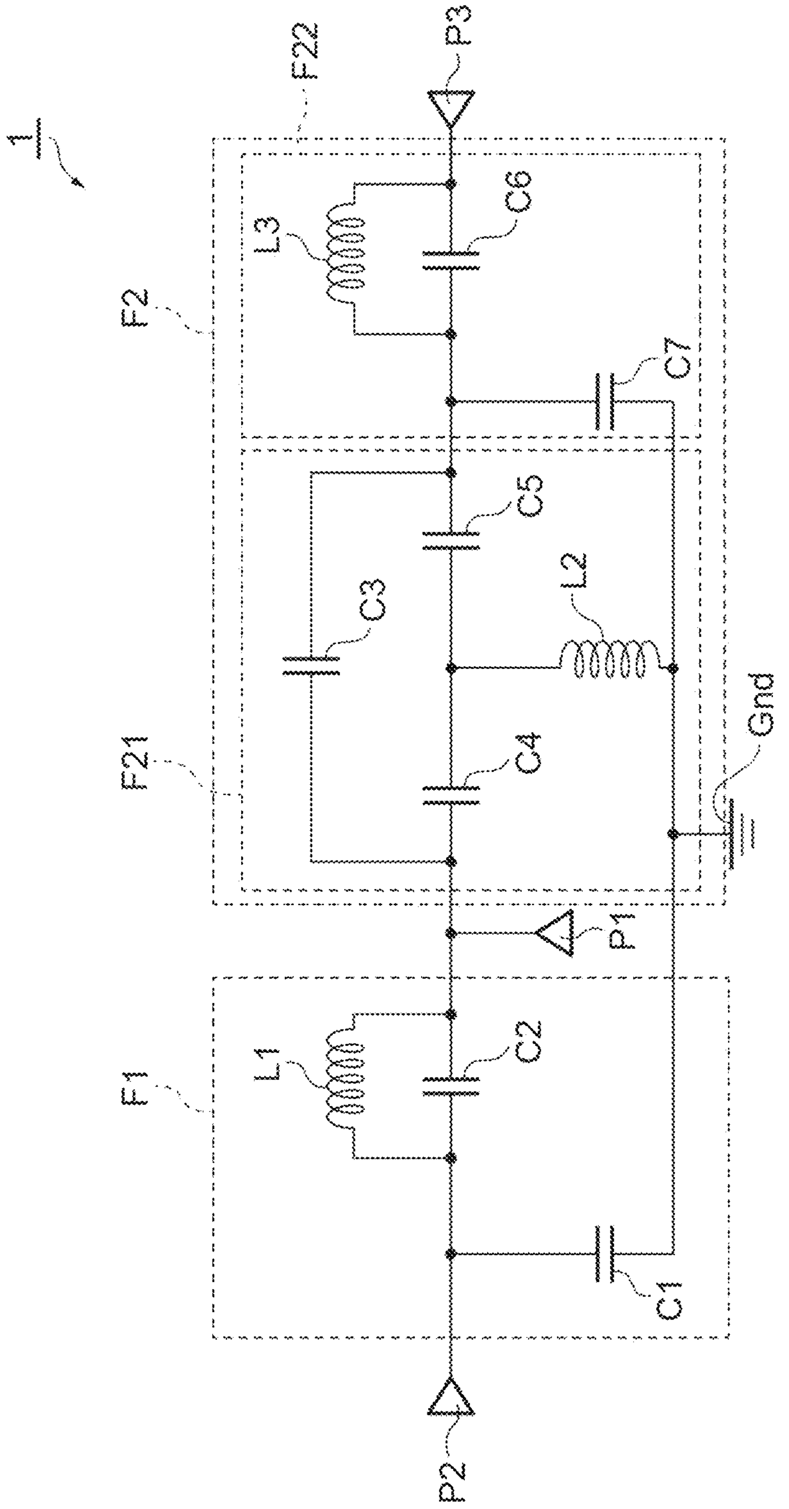
FIG. 7 is an equivalent circuit diagram of the electronic component illustrated in FIG. 1.

FIG. 7 is an equivalent circuit diagram of the electronic component 1 illustrated in FIG. 1. As illustrated in FIG. 7, the electronic component 1 includes a common port P1, a low port P2, a high port P3, a ground Gnd, an inductor (first inductor) L1, an inductor (second inductor) L2, an inductor (third inductor) L3, a capacitor C1, a capacitor C2, a capacitor C3, a capacitor C4, a capacitor C5, a capacitor C6, and a capacitor C7.

The common port P1 includes the third terminal electrode 6. The low port P2 includes the first terminal electrode 4. The high port P3 includes the second terminal electrode 5. The ground Gnd includes the fourth terminal electrode 7.

The inductor L1 includes the second pattern portion 17B of the conductor pattern 17, the conductor pattern 25, the conductor pattern 35, and the second pattern portion 41B of the conductor pattern 41. The second pattern portion 17B of the conductor pattern 17, the conductor pattern 25, the conductor pattern 35, and the second pattern portion 41B of the conductor pattern 41 constitute a winding portion (winding portion) W1 (see FIG. 2) of the inductor L1. The inductor L1 is formed by winding on a first conductor layer EL1 (see FIG. 8) that includes two or more conductor layers of a plurality of conductor layers. In the present embodiment, the inductor L1 is formed by winding on the four conductor layers 10, 11, 12, and 13. That is, the first conductor layer EL1 includes the four conductor layers 10, 11, 12, and 13.

The inductor L2 includes the conductor pattern 19, the conductor pattern 26, and the conductor pattern 36. The conductor pattern 19, the conductor pattern 26, and the conductor pattern 36 constitute a winding portion W2 (see FIG. 2) of the inductor L2. The inductor L2 is formed by winding on a second conductor layer EL2 (see FIG. 8) that includes two or more conductor layers of the plurality of conductor layers. In the present embodiment, the inductor L2 is formed by winding on the three conductor layers 10, 11, and 12. That is, the second conductor layer EL2 includes the three conductor layers 10, 11, and 12.

The inductor L3 includes the first pattern portion 20A of the conductor pattern 20 and the conductor pattern 26. The first pattern portion 20A of the conductor pattern 20 and the conductor pattern 26 constitute a winding portion W3 (see FIG. 2) of the inductor L3. The inductor L3 is formed by winding on a third conductor layer EL3 (see FIG. 8) that includes one or more conductor layers of the plurality of conductor layers. In the present embodiment, the inductor L3 is formed by winding on the two conductor layers 10 and 11. That is, the third conductor layer EL3 includes the two conductor layers 10 and 11.

Figure 8:
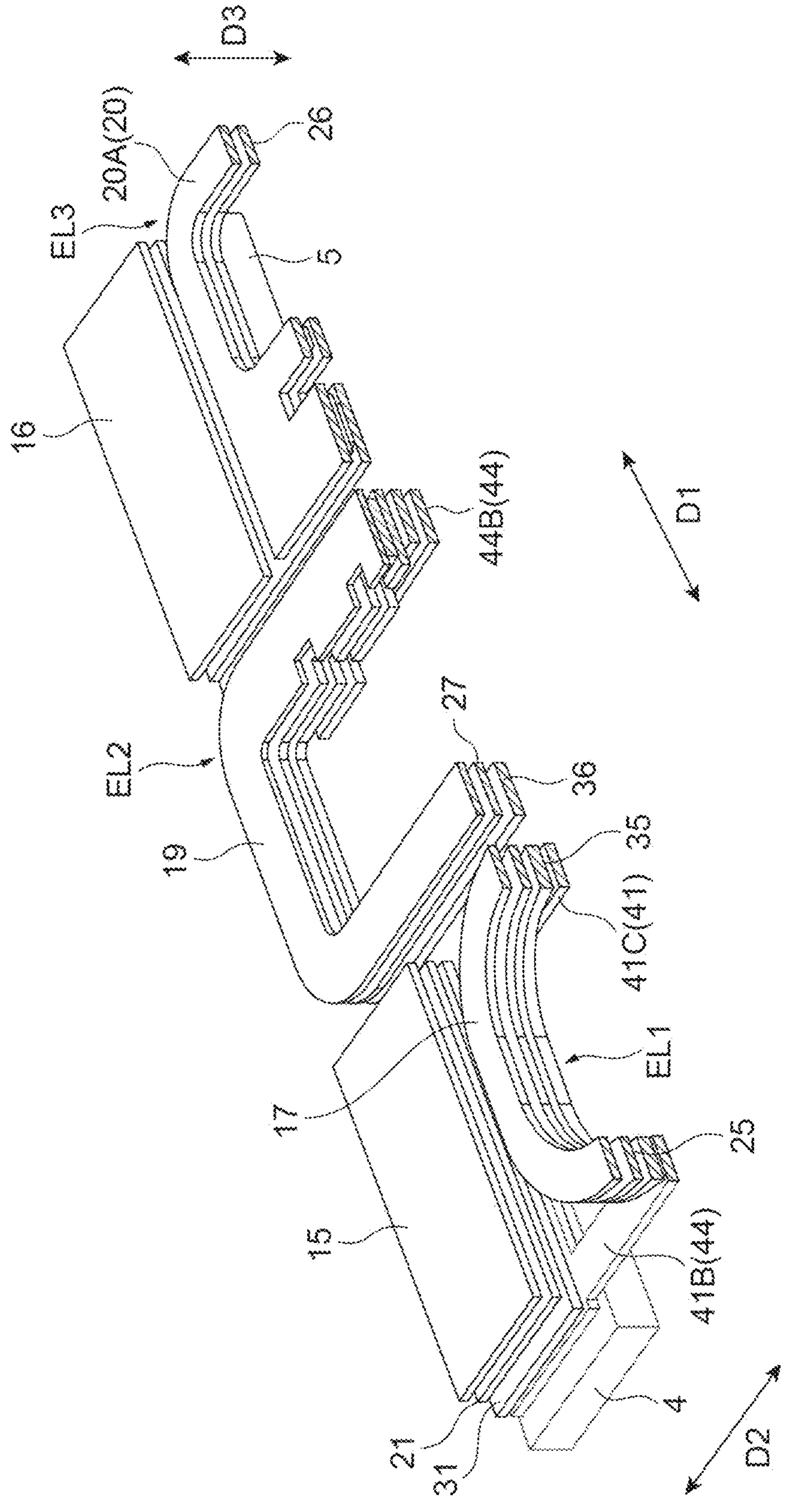
FIG. 8 is a perspective view illustrating a cross-sectional configuration taken along line C-C in FIG. 2.
Figure 9:
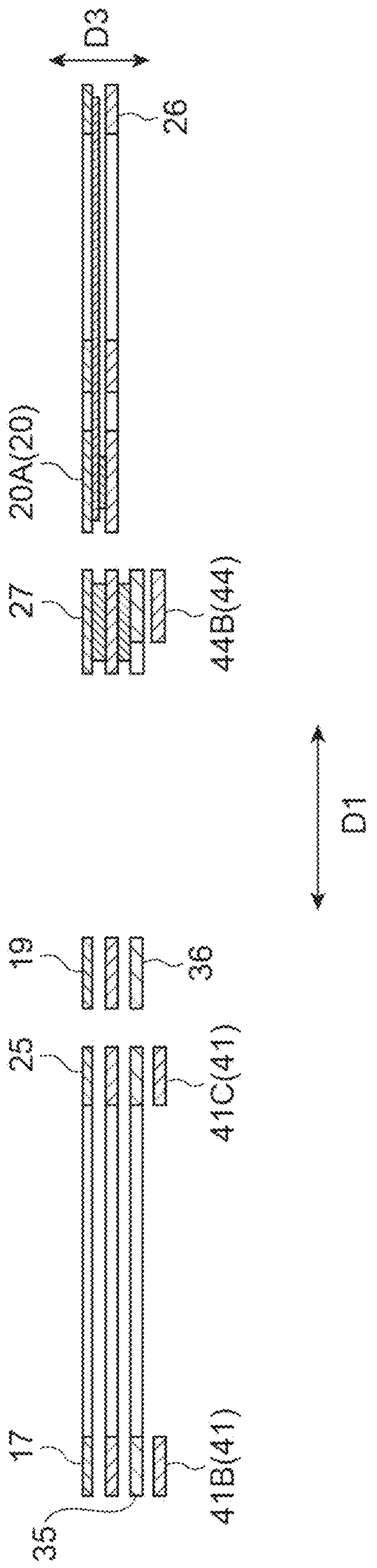
FIG. 9 is a view illustrating a cross-sectional configuration taken along line C-C in FIG. 2.

FIG. 8 is a perspective view illustrating a cross-sectional configuration taken along line C-C in FIG. 2. FIG. 9 is a view illustrating a cross-sectional configuration taken along line C-C in FIG. 2. As illustrated in FIGS. 8 and 9, the third conductor layer EL3 is positioned at the identical vertical position to a part of the first conductor layer EL1 and a part of the second conductor layer EL2 in the third direction D3. In other words, the third conductor layer EL3 is not positioned at the identical vertical position to a portion other than the part of the first conductor layer EL1 and a portion other than the part of the second conductor layer EL2 in the third direction D3.

The first conductor layer EL1 is disposed across the positions of the conductor layers 10, 11, 12, and 13. The second conductor layer EL2 is disposed across the positions of the conductor layers 10, 11, and 12. The third conductor layer EL3 is disposed across the positions of the conductor layers 10 and 11. The third conductor layer EL3 is positioned at the identical vertical position to the first conductor layer EL1 and the second conductor layer EL2 at the vertical positions of the conductor layers 10 and 11. The third conductor layer EL3 is not disposed at the vertical positions of the conductor layers 12 and 13.

In the electronic component 1, each of the number of conductor layers constituting the first conductor layer EL1 and the number of conductor layers constituting the second conductor layer EL2 is larger than the number of conductor layers constituting the third conductor layer EL3. In the present embodiment, the number of conductor layers constituting the first conductor layer EL1 is larger than the number of conductor layers constituting the second conductor layer EL2. That is, in the electronic component 1 according to the present embodiment, the following relationship is satisfied:

the number of conductor layers constituting the first conductor layer EL1>the number of conductor layers constituting the second conductor layer EL2>the number of conductor layers constituting the third conductor layer EL3.

As illustrated in FIG. 2, the inductor L1, the inductor L2, and the inductor L3 are disposed side by side in the first direction D1 in a plan view viewed in the third direction D3. The inductor L1 is disposed in a region on the end surface 3*a* side of the insulator 3 (one end side of the insulator 3 in the first direction D1). The inductor L3 is disposed in a region on the end surface 3*b* side of the insulator 3 (the other end side of the insulator 3 in the first direction D1). The inductor L2 is disposed in a region between the region where the inductor L1 is disposed and the region where the inductor L3 is disposed.

In the electronic component 1, a central axis (coil axis) Ax1 of the inductor L1, a central axis Ax2 of the inductor L2, and a central axis Ax3 of the inductor L3 are along the third direction D3. In the electronic component 1, the central axis Ax1 of the inductor L1, the central axis Ax2 of the inductor L2, and the central axis Ax3 of the inductor L3 are offset from one another in the second direction D2 in a plan view viewed in the third direction D3. That is, the central axis Ax1 of the inductor L1, the central axis Ax2 of the inductor L2, and the central axis Ax3 of the inductor L3 are not positioned on the same straight line along the first direction D1. In the present embodiment, the central axis Ax1 of the inductor L1 is offset toward the side surface 3*f* side of the insulator 3 with respect to the central axis Ax2 of the inductor L2. The central axis Ax2 of the inductor L2 is offset toward the side surface 3*e* side of the insulator 3 with respect to the central axis Ax1 of the inductor L1 and the central axis Ax3 of the inductor L3. The central axis Ax3 of the inductor L3 is offset toward the side surface 3*f* side of the insulator 3 with respect to the central axis Ax2 of the inductor L2.

As illustrated in FIG. 7, the capacitor C1 includes the conductor pattern 18 and the conductor pattern 28. More specifically, the capacitor C1 includes a part of the conductor pattern 18 disposed on the conductor layer 10 and the third pattern portion 18C disposed on the intermediate conductor layer, and the third pattern portion 18C is electrically connected to the conductor pattern 28. The capacitor C2 includes the conductor pattern 17 and the conductor pattern 28. More specifically, the capacitor C2 includes a part of the conductor pattern 17 disposed on the conductor layer 10 and the fifth pattern portion 17E disposed on the intermediate conductor layer, and the fifth pattern portion 17E is electrically connected to the conductor pattern 28.

The capacitor C3 includes the conductor pattern 20 and the conductor pattern 30. More specifically, the capacitor C3 includes a part of the conductor pattern 20 disposed on the conductor layer 10 and the fourth pattern portion 20D disposed on the intermediate conductor layer, and the fourth pattern portion 20D is electrically connected to the conductor pattern 30. The capacitor C4 includes the conductor pattern 17 and the conductor pattern 29. More specifically, the capacitor C4 includes the conductor pattern 17 disposed on the conductor layer 10 and the sixth pattern portion 17F disposed on the intermediate conductor layer, and the sixth pattern portion 17F is electrically connected to the conductor pattern 29.

The capacitor C5 includes the conductor pattern 20 and the conductor pattern 29. More specifically, the capacitor C5 includes a part of the conductor pattern 20 disposed on the conductor layer 10 and the fifth pattern portion 20E disposed on the intermediate conductor layer, and the fifth pattern portion 20E is electrically connected to the conductor pattern 29. The capacitor C6 includes the conductor pattern 20 and the conductor pattern 26. More specifically, the capacitor C6 includes a part of the conductor pattern 20 disposed on the conductor layer 10 and the third pattern portion 20C disposed on the intermediate conductor layer, and the third pattern portion 20C is electrically connected to the conductor pattern 26.

The capacitor C7 includes the conductor pattern 20 and the conductor pattern 24. More specifically, the capacitor C7 includes a part of the conductor pattern 20 disposed on the conductor layer 10 and the sixth pattern portion 20F disposed on the intermediate conductor layer, and the sixth pattern portion 20F is electrically connected to the conductor pattern 24.

The inductor L1, the capacitor C1, and the capacitor C2 constitute a first filter circuit F1. The inductor L2, the inductor L3, the capacitor C3, the capacitor C4, the capacitor C5, the capacitor C6, and the capacitor C7 constitute a second filter circuit F2.

The second filter circuit F2 includes a first partial circuit F21 and a second partial circuit F22. The first partial circuit F21 includes the inductor L2, the capacitor C3, the capacitor C4, and the capacitor C5. The second partial circuit F22 includes the inductor L3, the capacitor C6, and the capacitor C7.

The first filter circuit F1 processes a signal in a first frequency band. In the present embodiment, the first filter circuit F1 is, for example, a low-pass filter. The second filter circuit F2 processes a signal in a second frequency band. The second frequency band is a frequency band higher than the first frequency band. In the present embodiment, the second filter circuit F2 is, for example, a high-pass filter. The first partial circuit F21 is a filter circuit allowing a signal having a frequency equal to or higher than the third frequency to pass. The second partial circuit F22 is a filter circuit allowing a signal having a frequency higher than the third frequency and equal to or lower than the fourth frequency to pass.

Figure 10:
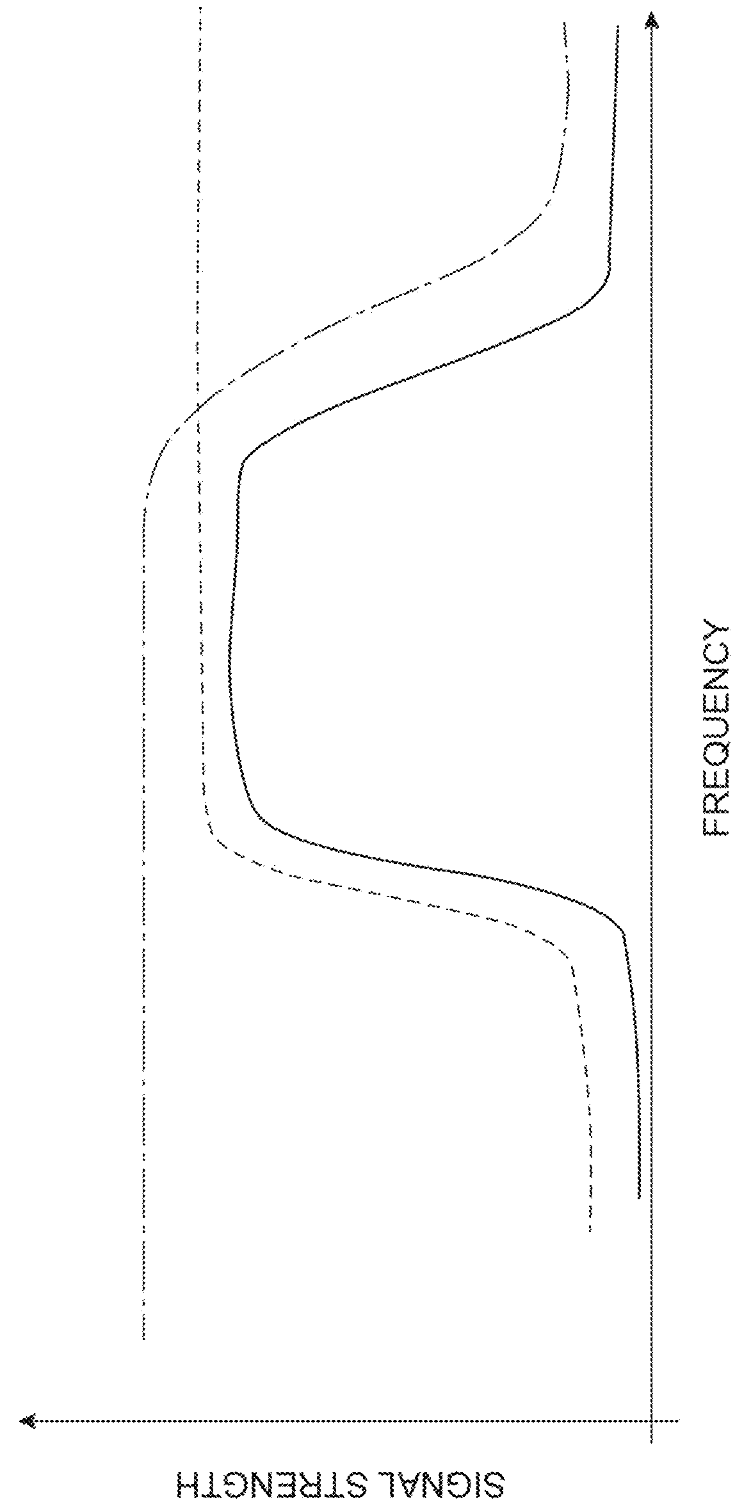
FIG. 10 is a diagram illustrating a relationship between frequency and signal strength.

FIG. 10 is a diagram illustrating a relationship between frequency and signal strength. In FIG. 10, the horizontal axis represents the frequency, and the vertical axis represents the signal strength. In FIG. 10, the characteristic of the second filter circuit F2 is indicated by a solid line, the characteristic of the first partial circuit F21 is indicated by a broken line, and the characteristic of the second partial circuit F22 is indicated by a one-dot chain line. As illustrated in FIG. 8, the second filter circuit F2 has a function similar to that of a band pass filter because the first partial circuit F21 acting as a low-pass filter in the second filter circuit F2 allows a signal having a frequency equal to or higher than the third frequency to pass, and the second partial circuit F22 acting as a high-pass filter in the second filter circuit F2 allows a signal having a frequency higher than the third frequency and equal to or lower than the fourth frequency to pass.

As described above, in the electronic component 1 according to the present embodiment, the third conductor layer EL3 is positioned at the identical vertical position to a part of the first conductor layer EL1 and a part of the second conductor layer EL2 in the third direction D3. In other words, in the electronic component 1, the third conductor layer EL3 is not positioned at the identical vertical position to a portion other than the part of the first conductor layer EL1 and a portion other than the part of the second conductor layer EL2 in the third direction D3. In addition, in the electronic component 1, each of the number of conductor layers constituting the first conductor layer EL1 and the number of conductor layers constituting the second conductor layer EL2 is larger than the number of conductor layers constituting the third conductor layer EL3. As a result, in the electronic component 1, electromagnetic coupling between the inductor L2 and the inductor L3 can be minimized. Therefore, in the electronic component 1, the loss can be reduced.

In the electronic component 1 according to the present embodiment, the central axes Ax2 and Ax3 of the inductor L2 and inductor L3 are offset from each other in the second direction D2 in a plan view viewed in the third direction D3. In this configuration, the electromagnetic coupling between the inductor L2 and the inductor L3 can be further minimized by offsetting (shifting) the central axes Ax2 and Ax3 of the inductor L2 and inductor L3 from each other.

In the electronic component 1 according to the present embodiment, the inductor L2 is electrically connected to the fourth terminal electrode 7 via the second pattern portion 44B disposed on the conductor layer 13 disposed between the first terminal electrode 4, the second terminal electrode 5, the third terminal electrode 6, and the fourth terminal electrode 7 and the third conductor layer EL3 in the third direction D3. The third conductor layer EL3 is not adjacent to the conductor layer 13 on which the second pattern portion 44B is disposed in the third direction D3. In this configuration, since the second pattern portion 44B connected to the inductor L2 and the third conductor layer EL3 are not adjacent to each other, electromagnetic coupling between the second pattern portion 44B and the inductor L3 formed by winding on the third conductor layer EL3 can be minimized. Therefore, in the electronic component 1, the loss can be further reduced.

In the electronic component 1 according to the present embodiment, the number of layers of the first conductor layer EL1 is larger than the number of layers of the second conductor layer EL2. In this configuration, the number of layers of the first conductor layer EL1 is different from the number of layers of the second conductor layer EL2. As a result, in the electronic component 1, electromagnetic coupling between the inductor L1 formed by winding on the first conductor layer EL1 and the inductor L2 formed by winding on the second conductor layer EL2 can be minimized.

In the electronic component 1 according to the present embodiment, in a part of the second conductor layer EL2 and a part of the third conductor layer EL3 disposed at the identical vertical position in the third direction D3, a part of the conductor pattern 27 constituting the inductor L2 and a part of the conductor pattern 26 constituting the inductor L3 are adjacent to each other. In the electronic component 1, the gap S is formed in the conductor pattern 27 in the portion where the conductor pattern 27 and the conductor pattern 26 are adjacent to each other. In this configuration, since the gap is formed in the conductor pattern 27 in a portion where the inductor L2 and the inductor L3 are adjacent to each other, electromagnetic coupling between the inductor L2 and the inductor L3 can be further minimized.

Although the embodiments of the present disclosure have been described above, the present disclosure is not necessarily limited to the above-described embodiments, and various modifications can be made without departing from the gist thereof.

In the above-described embodiment, the example in which the electronic component 1 satisfies the following relationship is exemplified:

the number of conductor layers constituting the first conductor layer EL1>the number of conductor layers constituting the second conductor layer EL2>the number of conductor layers constituting the third conductor layer EL3. However, in the electronic component 1, each of the number of conductor layers constituting the first conductor layer EL1 and the number of conductor layers constituting the second conductor layer EL2 is only sufficient to be larger than the number of conductor layers constituting the third conductor layer EL3.

In the above-described embodiment, the example in which the central axis Ax1 of the inductor L1, the central axis Ax2 of the inductor L2, and the central axis Ax3 of the inductor L3 are offset from one another in the second direction D2 in a plan view viewed in the third direction D3 is exemplified. However, in the electronic component 1, at least the central axes Ax2 and Ax3 of the inductor L2 and inductor L3 are only sufficient to be offset from each other in the second direction D2.

What is claimed is:

1. An electronic component comprising:

an element body including a plurality of insulating layers and a plurality of conductor layers, the plurality of insulating layers and the plurality of conductor layers being stacked;

a plurality of terminals disposed on the element body;

a first filter circuit including at least one or more conductor layers of the plurality of conductor layers and configured to process a signal in a first frequency band; and a second filter circuit including at least one or more conductor layers of the plurality of conductor layers and configured to process a signal in a second frequency band higher than the first frequency band, wherein the first filter circuit includes a first inductor formed by winding on a first conductor layer including two or more conductor layers of the plurality of conductor layers, the second filter circuit includes a second inductor formed by winding on a second conductor layer including two or more conductor layers of the plurality of conductor layers, and a third inductor formed by winding on a third conductor layer including one or more conductor layers of the plurality of conductor layers, the first inductor, the second inductor, and the third inductor are disposed side by side in a first direction orthogonal to a stacking direction in which the plurality of conductor layers is stacked in a plan view viewed in the stacking direction, the third conductor layer is positioned at an identical vertical position to a part of the first conductor layer and a part of the second conductor layer in the stacking direction, and each of a number of conductor layers of the plurality of conductor layers constituting the first conductor layer and a number of conductor layers of the plurality of conductor layers constituting the second conductor layer is larger than a number of conductor layers of the plurality of conductor layers constituting the third conductor layer.

2. The electronic component according to claim 1, wherein, in the plan view viewed in the stacking direction, central axes of the second inductor and the third inductor are offset from each other in a second direction orthogonal to the first direction.

3. The electronic component according to claim 1, wherein the second inductor is electrically connected to a first terminal of the plurality of terminals via a conductor pattern disposed on a conductor layer of the plurality of conductor layers, the conductor layer being disposed between the plurality of terminals and the third conductor layer in the stacking direction, and the third conductor layer is not adjacent to the conductor layer on which the conductor pattern is disposed in the stacking direction.

4. The electronic component according to claim 1, wherein the number of conductor layers of the first conductor layer is larger than the number of conductor layers of the second conductor layer.

5. The electronic component according to claim 1, wherein in the part of the second conductor layer and a part of the third conductor layer positioned at an identical vertical position in the stacking direction, a part of a second conductor pattern constituting the second inductor and a part of a third conductor pattern constituting the third inductor are adjacent to each other, and in a portion where the second conductor pattern constituting the second inductor and the third conductor pattern constituting the third inductor are adjacent to each other, a gap is formed in one of the second conductor pattern and the third conductor pattern.

6. The electronic component according to claim 1, wherein the second filter circuit includes a first partial circuit including the second inductor and a second partial circuit including the third inductor, the first partial circuit is a filter circuit configured to allow a signal having a frequency equal to or higher than a third frequency to pass, and the second partial circuit is a filter circuit configured to allow a signal having a frequency higher than the third frequency and equal to or lower than a fourth frequency to pass.

7. The electronic component according to claim 6, wherein the first filter circuit includes a first capacitor electrically connected in parallel with the first inductor, the second filter circuit includes a second capacitor electrically connected in parallel with the second inductor, the first capacitor includes a part of a winding portion of the first inductor, and the second capacitor includes a part of a winding portion of the third inductor.

* * * * *